United States Patent [19]
Johnson

[11] 3,778,899

[45] Dec. 18, 1973

[54] MOUNTING PREFORMED CIRCUITS ON FLEXIBLE DIELECTRIC SUBSTRATES

[75] Inventor: E. Curtis Johnson, Mahtomedi, Minn.

[73] Assignee: Buckbee-Mears Company, St. Paul, Minn.

[22] Filed: Nov. 12, 1971

[21] Appl. No.: 198,147

[52] U.S. Cl. ...................... 29/625, 29/624, 174/68.5
[51] Int. Cl. ............................................ H05k 3/20
[58] Field of Search .................. 204/11, 42; 29/625, 29/626, 627; 156/18; 174/68.5; 117/212

[56] References Cited

UNITED STATES PATENTS 2,997,521 8/1961 Dahlgren ......................... 29/625 X
3,414,487 12/1968 Helms et al. ......................... 204/11

*Primary Examiner*—Charles W. Lanham
*Assistant Examiner*—Joseph A. Walkowski
*Attorney*—Marvin Jacobson et al.

[57] ABSTRACT

A process for preparing preformed circuits for mounting on a flexible dielectric substrate in which the preformed circuit is subject to a strong alkaline bath so as to add oxygen atoms to the surface of the circuit to increase the incidence of hydrogen bonds between the circuits and the dielectric substrate.

7 Claims, 4 Drawing Figures

INVENTOR
E. CURTIS JOHNSON
BY
Stryker & Jacobson
ATTORNEYS

MOUNTING PREFORMED CIRCUITS ON FLEXIBLE DIELECTRIC SUBSTRATES

BACKGROUND OF THE INVENTION

In the prior art flexible printed circuitry has generally been constructed by laminating a metallic foil, such as copper, to a flexible dielectric substrate. The substrate may comprise a dielectric film with a suitable adhesive on it designed to hold the metallic foil in place. Other variations include thermoplastics such as polyethylene in which the metallic foil is affixed to the surface thereof through the application of heat. A new type of flexible dielectric substrate comprises a resin base which is bonded to the copper foil during the curing of the substrate itself. This newer flexible substrate is the subject of the copending patent application filed in the name of E. Curtis Johnson and William D. Cross on Nov. 8, 1971 and having Ser. No. 196,436, now abandoned. The present invention is suitably applicable to all of the above types of dielectric substrates.

SUMMARY OF THE INVENTION

Since all of these substrates comprise chemical compositions including hydrogen atoms, the strength of the bond between the metallic foil and the substrate can be increased by subjecting the foil to a strong alkaline bath, containing labile oxygen, so as to provide a very thin layer of oxygen atoms on the surface of the metal foil. These oxygen atoms form weak chemical bonds, commonly referred to in the chemical arts as hydrogen bonds, with the hydrogen atoms in the dielectric substrate. Because of these bonds, the preformed circuits tend to be much more firmly bonded to the flexible dielectric substrate than has been the case in the prior art. It may therefore be seen that it is an object of the present invention to provide a flexible printed circuit for use with preformed circuits in which the preformed circuits are more tightly bonded to the flexible dielectric substrate. Further objects and advantages will become apparent upon consideration of the following description and drawings.

DESCRIPTION OF THE PREFERRED EMBODIMENT

Figure 1:
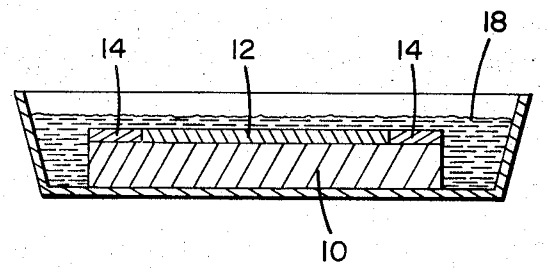
FIGS. 1, 2, 3 and 4 show subsequent major steps in the process of bonding a preformed circuit to a dielectric substrate according to the present invention.

In FIG. 1 a suitable base plate 10 is shown having some type of preformed circuit 12 electrodeposited or otherwise formed on the top surface. Base 10 may comprise stainlesssteel, nickel, or any other suitable base material and may or may not include a resist coating 14 in the areas not covered by the preformed circuit 12. In the preferred embodiment, a resist 14 is used in the uncovered areas and therefore, this structure is shown in FIG. 1. Generally, the preformed circuit 12 comprises copper although other conducting metals may be employed as well. It should be noted that in the prior art preformed circuit 12 would simply be bonded to a dielectric substrate in order to form a printed circuit. Such bonds have been found to be undesirable weak in many cases. The present invention, however, adds several additional steps designed to provide a much more secure and tenacious bond between the preformed circuit 12 and the dielectric substrate 22. This is particularly advantageous with flexible dielectric circuits in which the bond between the substrate and the circuit is subject to considerable stress.

As shown in FIG. 1, base plate 10 and preformed circuit 12 are immersed in a suitable bath 18 which comprises a strong alkaline solution containing labile oxygen to slightly oxidize the surface of the copper preformed circuit 12. In the preferred embodiment, sodium hypochlorite or ammonium persulfate have been used with considerable success although other strong oxidizers may also be suitable.

It is essential that a very thin layer of oxygen atoms be established on the surface of the preformed circuit, preferably approximating the thickness of a single layer of oxygen atoms. This layer of oxygen atoms is referred to as a mono-layer herein. As stated earlier, these oxygen atoms are believed to have the capability of forming weak chemical bonds or hydrogen bonds with the hydrogen atoms found in the dielectric substrate materials typically used. Substrate materials include most thermoplastics and resin based plastics, all of which have an abundance of hydrogen atoms in their chemical composition. The bath treatment must not be extended too long or conducted at too high a temperature since the oxidization can proceed to the point where more than a monolayer is developed. A thick layer of oxidization material actually produces a weaker bond than what would otherwise be the case, and this is, therefore, undesirable. By way of example, it should be noted that in one preferred embodiment which utilized a bath comprising sodium hypochlorite in commercially available strengths, it was found that the bath treatment should be conducted at temperatures in the range of about 85° to 95°C. It was also found that the bath should last at least 10 seconds but should not last longer than about 200 seconds. The most successful bonds were created at a temperature of about 90°C. and for periods of time close to 30 seconds. With these temperatures and times, mono-layers of oxygen were consistently developed on the surface of the copper preformed circuit. The process can be conducted at higher temperatures for shorter times but this has been found to be undesirable due to the fact that the higher temperatures generally initiate boiling in the solutions which has been found to degrade their performance.

The ammonium persulfate solution differs from the sodium hypochlorite solution in that temperatures in the range of 70° to 80° C. are more suitable.

Figure 2:
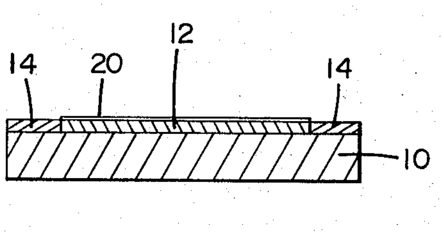

In FIG. 2 it may be seen that base 10 is removed from the bath with a very thin mono-layer 20 comprising oxygen atoms suitable for forming hydrogen bonds. The base is rinsed with water to remove any remaining solution from the bath and hot air dried to avoid any possible scratching of the surface which would remove the delicate mono-layer of oxygen atoms and thereby degrade the bond at the scratch.

Figure 3:
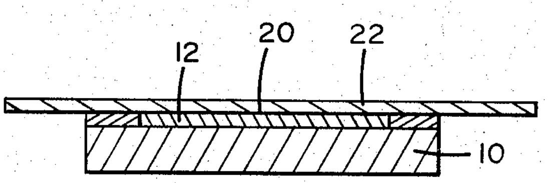

Once the preformed circuit has been thoroughly dried, it may be bonded to the dielectric substrate 22 as shown in FIG. 3. Substrate 22 is applied directly to the preformed circuit 12 under pressure and heat so as to laminate the dielectric substrate to the preformed circuit and induce the hydrogen bond formations. As mentioned earlier, the preferred embodiment uses a resin base dielectric substrate as described in the above-referenced co-pending application. In this process the resin based substrate is partially cured before lamination and then finally cured during lamination.

The final curing and lamination takes place at a temperature in the range of about 300+ F. to 500° F. and under a pressure of from 50 pounds to 750 pounds per square inch.

Figure 4:
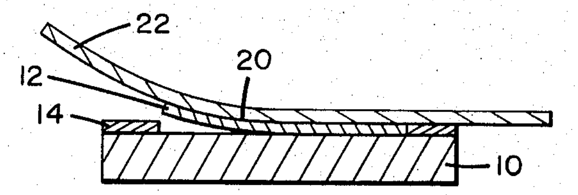

Upon completion of the bonding, the dielectric substrate 22 is stripped from the base 10 as shown in FIG. 4. Preformed circuit 12 remains tenaciously bonded to the substrate due to the hydrogen bonds formed at the junction 20 between circuit 12 and substrate 22.

Many variations to the present process are possible without departing from the spirit and scope of the invention. For example, if, in fact, the bath described in FIG. 1 lasts too long or is conducted at too high a temperature so as to form a layer of oxygen atoms which is too thick, it is possible to remove the excess layers of oxidization by means of a suitable washing step added before the rinsing step of FIG. 2. Any variety of cleaners can be employed in this washing step to remove the excess layers of oxidized material leaving only a monolayer of oxygen on the preformed circuit. This is a less desirable approach, however, since during the washing process great care is necessary to avoid producing a layer of oxygen atoms which varies in thickness.

I claim:

1. A process for bonding preformed circuits to flexible dielectric substrates comprising the steps of forming the circuit on a base, immersing the base and circuit in an oxidizing alkaline bath for a period of time in the range of 10 to 200 seconds to form a very thin monolayer of oxide approximately the thickness of a single layer of oxygen atoms on the surface of the circuit, rinsing and drying the circuit, bonding a flexible dielectric to the oxidized face of the preformed circuit, and stripping the substrate with the circuit bonded thereto from the base.

2. The process of claim 1 in which said alkaline bath comprises sodium hypochlorite at a temperature in the range of 85° to 95° C.

3. The process of claim 1 in which said alkaline bath comprises ammonium persulfate at a temperature in the range of 70° to 80° C.

4. The process of claim 1 including a washing step before the rinsing and drying step so as to remove excess oxidized material.

5. The process of claim 1 in which said period of time is about 30 seconds.

6. The process of claim 5 in which said alkaline bath comprises sodium hypochlorite at a temperature in the range of 85° to 95° C.

7. The process of claim 5 in which said alkaline bath comprises ammonium persulfate at a temperature in the range of 70° to 80° C.

* * * * *